(12) United States Patent
Kojima et al.

(10) Patent No.: US 11,532,780 B2
(45) Date of Patent: Dec. 20, 2022

(54) ULTRASONIC SENSOR AND ELECTRONIC DEVICE

(71) Applicant: SEIKO EPSON CORPORATION, Tokyo (JP)

(72) Inventors: Chikara Kojima, Matsumoto (JP); Koji Ohashi, Matsumoto (JP); Hironori Suzuki, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 539 days.

(21) Appl. No.: 16/690,845

(22) Filed: Nov. 21, 2019

(65) Prior Publication Data

US 2020/0166638 A1 May 28, 2020

(30) Foreign Application Priority Data

Nov. 22, 2018 (JP) .............................. JP2018-219028

(51) Int. Cl.
*H01L 41/113* (2006.01)
*G01S 15/08* (2006.01)
*H01L 27/20* (2006.01)
*G01S 7/521* (2006.01)

(52) U.S. Cl.
CPC .......... *H01L 41/1132* (2013.01); *G01S 7/521* (2013.01); *G01S 15/08* (2013.01); *H01L 27/20* (2013.01); *H01L 41/1134* (2013.01)

(58) Field of Classification Search
CPC ......... G01S 15/08; G01S 7/521; H01L 27/20; H01L 41/1132; H01L 41/1134; H01L 41/053; H01L 41/081; H01L 41/0973; B06B 1/0622; B06B 1/0629; B06B 1/0607; B06B 1/06

See application file for complete search history.

(56) References Cited

U.S. PATENT DOCUMENTS

| | | | |
|---|---|---|---|
| 9,440,258 B2* | 9/2016 | Klee | B06B 1/0688 |
| 9,554,775 B2* | 1/2017 | Nakamura | G03B 42/06 |
| 9,772,314 B2* | 9/2017 | Kojima | G10K 11/28 |
| 9,818,926 B2* | 11/2017 | Suzuki | G10K 11/02 |
| 9,987,663 B2* | 6/2018 | Kojima | G10K 11/002 |

(Continued)

FOREIGN PATENT DOCUMENTS

| | | |
|---|---|---|
| JP | 2015-188208 A | 10/2015 |
| JP | 2016-005222 A | 1/2016 |
| JP | 2018-142830 A | 9/2018 |

*Primary Examiner* — Eduardo A Rodela
(74) *Attorney, Agent, or Firm* — Oliff PLC

(57) ABSTRACT

An ultrasonic sensor includes an element substrate having a first and a second surface at an opposite side of the first surface, including an opening section piercing through the element substrate in a Z direction from the first to second surface, a vibrating plate on the first surface of the element substrate to close the opening section, a plurality of vibration regions extending along an X direction orthogonal to the Z direction on the vibration plate in positions overlapping the opening section, and a plurality of piezoelectric elements to correspond to the plurality of vibration regions of the vibration plate. The opening section includes, on the first surface, a first and second side parallel to the X direction and a third and fourth side coupling end portions in the X direction of the first and second sides at an acute or obtuse angle to the first and the second side.

5 Claims, 9 Drawing Sheets

(56) References Cited

U.S. PATENT DOCUMENTS

| | | | | |
|---|---|---|---|---|
| 10,512,453 | B2* | 12/2019 | Kano | A61B 8/56 |
| 10,966,683 | B2* | 4/2021 | Bryzek | B81C 1/00238 |
| 11,181,627 | B2* | 11/2021 | Ishii | G01S 7/521 |
| 2006/0186762 | A1* | 8/2006 | Sugiura | H03H 3/02 |
| | | | | 310/334 |
| 2007/0251324 | A1* | 11/2007 | Wado | B06B 1/0688 |
| | | | | 73/649 |
| 2013/0258802 | A1* | 10/2013 | Nakamura | G01S 7/5208 |
| | | | | 367/137 |
| 2014/0103781 | A1* | 4/2014 | Nakamura | A61B 8/4494 |
| | | | | 310/334 |
| 2015/0258573 | A1 | 9/2015 | Kojima | |
| 2018/0154394 | A1* | 6/2018 | Haque | A61B 8/4494 |
| 2018/0243795 | A1 | 8/2018 | Kojima | |

\* cited by examiner

FIG. 2
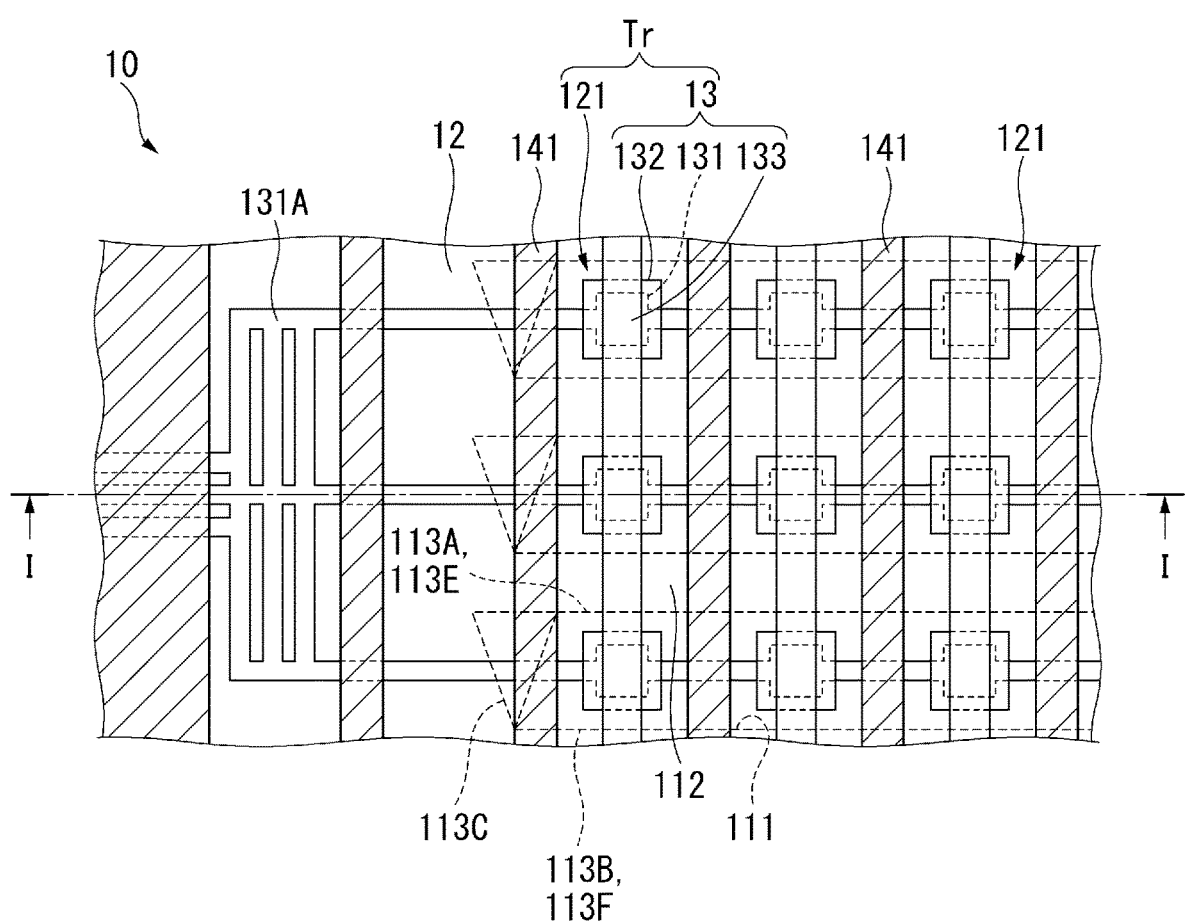
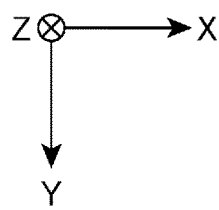

FIG. 3
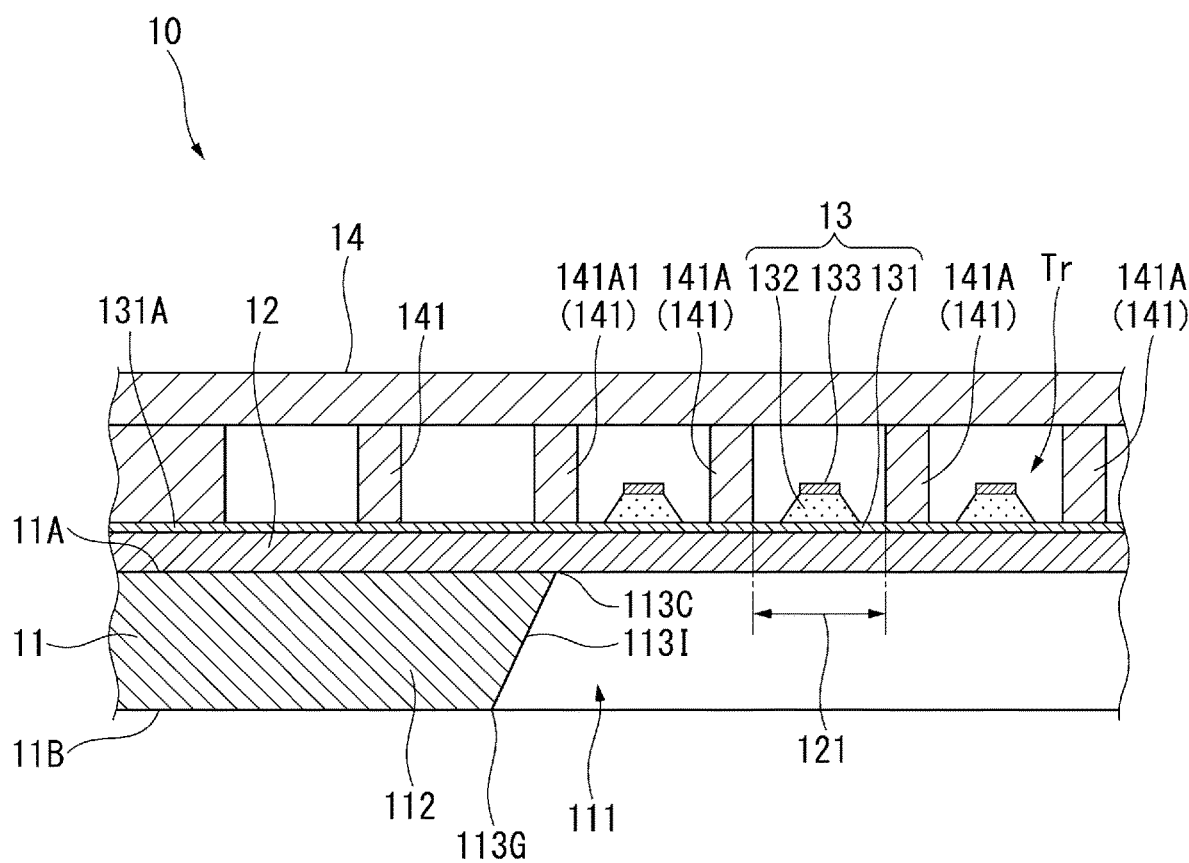
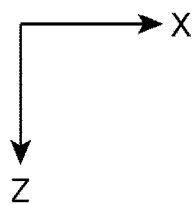

FIG. 4
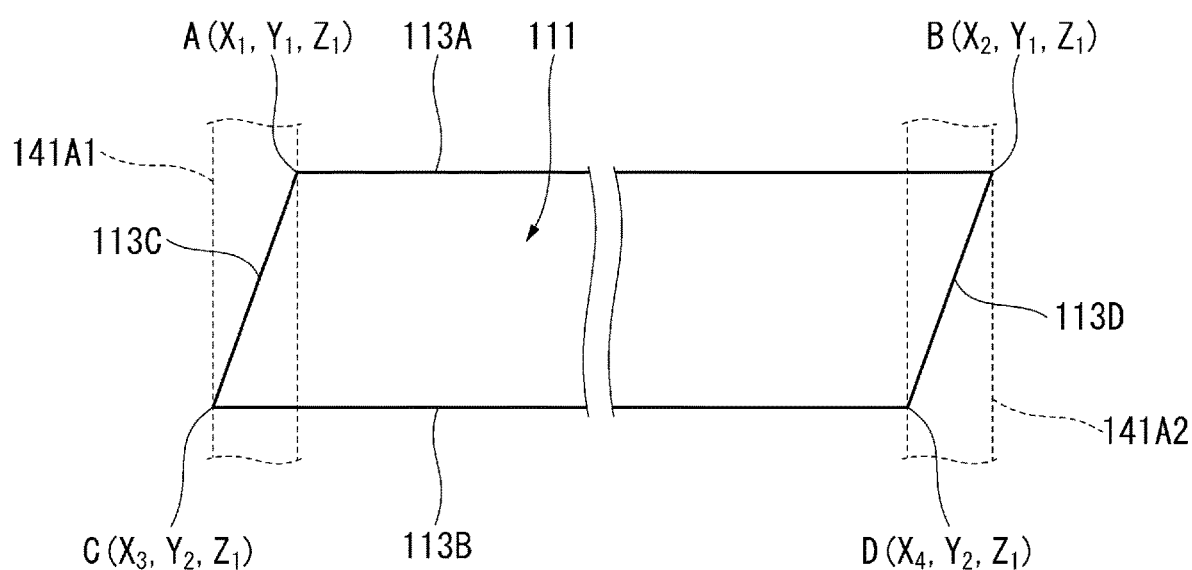
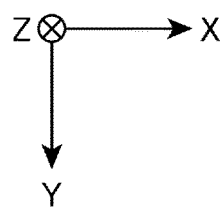

FIG. 7
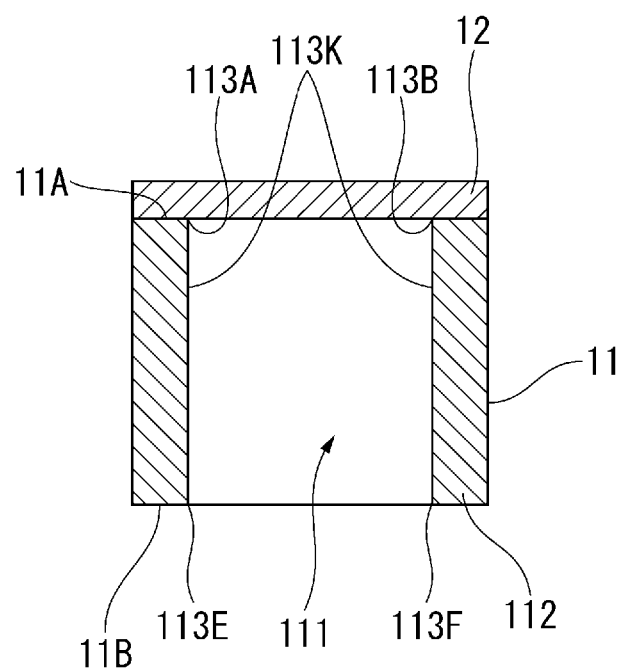
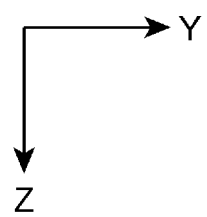

ULTRASONIC SENSOR AND ELECTRONIC DEVICE

The present application is based on, and claims priority from JP Application Serial Number 2018-219028, filed Nov. 22, 2018 the disclosure of which is hereby incorporated by reference herein in its entirety.

BACKGROUND

1. Technical Field

The present disclosure relates to an ultrasonic sensor and an electronic device.

2. Related Art

There has been known an ultrasonic sensor in which a vibrating plate closing an opening section is provided on one surface side of a substrate having the opening section and a piezoelectric element is disposed on the vibrating plate in a position corresponding to the opening section (see, for example, JP-A-2015-188208 (Patent Literature 1)).

In the ultrasonic sensor described in Patent Literature 1, the opening section is formed in a rectangular shape having an aspect ratio in which the length in a second direction is larger than the length in a first direction. A plurality of active sections are provided along the second direction on the vibrating plate closing the opening section. Columnar sections are provided among the active sections. Consequently, the active sections are surrounded by the opening section and edges of the columnar sections, whereby the size of the active sections are defined. The active sections are capable of transmitting and receiving ultrasound having a desired frequency.

However, the opening section of the ultrasonic sensor described in Patent Literature 1 is formed in the rectangular shape in plan view. Therefore, a part of ultrasound output into the opening section is reflected between both end portions of the rectangle and is input to the active sections again. In this case, crosstalk is caused by the ultrasound made incident on the active sections.

SUMMARY

An ultrasonic sensor according to a first application example includes: an element substrate having a first surface and a second surface at an opposite side of the first surface and including an opening section piercing through the element substrate in a Z direction from the first surface to the second surface; a vibrating plate provided on the first surface of the element substrate to close the opening section, a plurality of vibration regions extending along an X direction orthogonal to the Z direction being provided on the vibration plate in positions overlapping the opening section in plan view from the Z direction; and a plurality of piezoelectric elements provided to respectively correspond to the plurality of vibration regions of the vibration plate. The opening section includes, on the first surface, a first side and a second side parallel to the X direction and a third side and a fourth side coupling end portions in the X direction of the first side and the second side at an acute angle or an obtuse angle with respect to the first side and the second side.

In the ultrasonic sensor according to the application example, the opening section may include, on the second surface, a fifth side and a sixth side parallel to the X direction and a seventh side and an eighth side coupling end portions of the fifth side and the sixth side at an acute angle or an obtuse angle with respect to the first side and the fifth side, the first side and the fifth side may at least partially overlap each other in the plan view from the Z direction, and the second side and the sixth side may at least partially overlap each other in the plan view from the Z direction.

In the ultrasonic sensor according to the application example, when a direction orthogonal to the X direction is represented as a Y direction, the first side may be a side extended from a point A $(X_1, Y_1, Z_1)$ to a point B $(X_2, Y_1, Z_1)$ further at a +X side than the point A $(X_1, Y_1, Z_1)$ in an XYZ coordinate, the second side may be a side from a point C $(X_3, Y_2, Z_1)$ located further at a −X side and a +Y side than the point A $(X_1, Y_1, Z_1)$ to a point D $(X_4, Y_2, Z_1)$ located further at the −X side and the +Y side than the point B $(X_2, Y_1, Z_1)$ in the XYZ coordinate, the third side may be a side from the point A $(X_1, Y_1, Z_1)$ to the point C $(X_3, Y_2, Z_1)$ in the XYZ coordinate, the fourth side may be a side from the point B $(X_2, Y_1, Z_1)$ to the point D $(X_4, Y_2, Z_1)$ in the XYZ coordinate, the fifth side may be a side from a point E $(X_5, Y_1, Z_2)$ located further at the −X side, a −Y side, and a +Z side than the point C $(X_3, Y_2, Z_1)$ to a point F $(X_2, Y_1, Z_2)$ at the +Z side of the point B $(X_2, Y_1, Z_1)$ in the XYZ coordinate, the sixth side may be a side from a point G $(X_3, Y_2, Z_2)$ at the +Z side of the point C $(X_3, Y_2, Z_1)$ to a point H $(X_6, Y_2, Z_2)$ located further at the +X side, the +Y side, and the +Z side than the point B $(X_2, Y_1, Z_1)$ in the XYZ coordinate, and the opening section may include a first inclined surface extending from the point E $(X_5, Y_1, Z_2)$ to the third side and a second inclined surface extending from the point H $(X_6, Y_2, Z_2)$ to the fourth side.

The ultrasonic sensor according to the application example may further include a plurality of beam sections provided among the vibration regions adjacent to one another at an opposite side of the element substrate of the vibrating plate and dividing the vibrating plate overlapping the opening section in the plan view into the plurality of vibration regions.

In the ultrasonic sensor according to the application example, the third side and the fourth side may be provided in positions overlapping the beam sections in the plan view.

In the ultrasonic sensor according to the application example, the third side and the fourth side may be located further at a side separating from the vibration regions than the beam sections.

An electronic device according to a second application example includes: the ultrasonic sensor according to the first application example; and a control section configured to control the ultrasonic sensor.

BRIEF DESCRIPTION OF THE DRAWINGS

FIG. 2 is a schematic plan view showing a part of an ultrasonic sensor in the first embodiment.

FIG. 3 is a sectional view of the ultrasonic sensor taken along a I-I line in FIG. 2.

FIG. 4 is a diagram showing the shape of an opening edge at the time when an opening section of an element substrate in the first embodiment is viewed from a first surface side.

FIG. 7 is a sectional view showing a sectional shape of the element substrate and the vibrating plate taken along III-III line in FIG. 5.

DESCRIPTION OF EXEMPLARY EMBODIMENTS

First Embodiment

A first embodiment is explained below.

Figure 1:
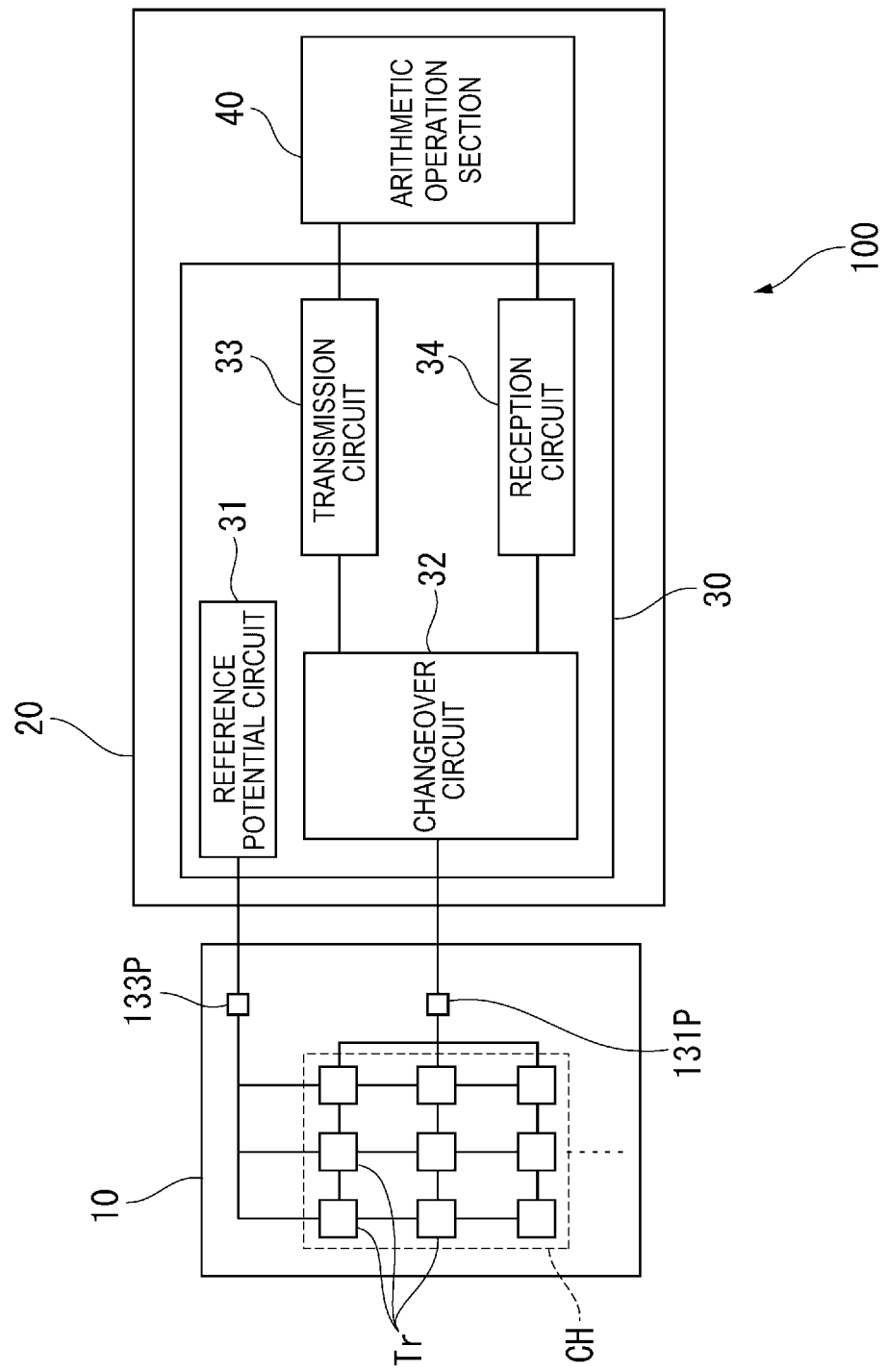
FIG. 1 is a block diagram showing a schematic configuration of a distance measuring device in a first embodiment.

FIG. 1 is a block diagram showing a schematic configuration of a distance measuring device 100, which is an example of an electronic device in the first embodiment.

As shown in FIG. 1, the distance measuring device 100 in this embodiment includes an ultrasonic sensor 10 and a control section 20 that controls the ultrasonic sensor 10. In the distance measuring device 100, the control section 20 controls the ultrasonic sensor 10 via a driving circuit 30 and transmits ultrasound from the ultrasonic sensor 10. When the ultrasound is reflected by a target object and a reflected wave is received by the ultrasonic sensor 10, the control section 20 calculates a distance from the ultrasonic sensor 10 to the target object based on a time from transmission timing of the ultrasound to reception timing of the ultrasound.

Such a configuration of the distance measuring device 100 is specifically explained below.

Configuration of the Ultrasonic Sensor 10

FIG. 2 is a schematic plan view showing a part of the ultrasonic sensor 10. FIG. 3 is a sectional view of the ultrasonic sensor 10 taken along a I-I line in FIG. 2.

The ultrasonic sensor 10 includes, as shown in FIG. 3, an element substrate 11, a vibrating plate 12, piezoelectric elements 13, and a sealing plate 14.

Configuration of the Element Substrate 11

The element substrate 11 is a substrate configured by a semiconductor substrate of Si or the like and having a predetermined thickness for supporting the vibration plate 12. The element substrate 11 has a first surface 11A and a second surface 11B at the opposite side of the first surface 11A. In the following explanation, a direction from the first surface 11A to the second surface 11B is represented as a Z direction, a direction orthogonal to the Z direction is represented as an X direction, and a direction orthogonal to the X direction and the Z direction is represented as a Y direction. The first surface 11A and the second surface 11B are surfaces parallel to an XY plane. In this embodiment, as an example, the Y direction is orthogonal to the X direction. However, the Y direction may be inclined at an angle other than 90° with respect to the X direction.

In the element substrate 11, an opening section 111 piercing through the element substrate 11 from the first surface 11A to the second surface 11B along the Z direction is provided. The opening section 111 is formed at an aspect ratio in which the length in the X direction is sufficiently longer than the length in the Y direction. In the element substrate 11, a plurality of such opening sections 111 are disposed along the Y direction.

The opening section 111 is explained in detail below.

A portion where the opening section 111 is not provided on the element substrate 11 configures a partition wall section 112. That is, the partition wall section 112 is provided to surround the opening section 111. The partition wall section 112 supports the vibrating plate 12 provided at the first surface 11A side of the element substrate 11. Consequently, the −Z side of the opening section 111 is closed by the vibrating plate 12.

Configuration of the Vibrating Plate 12

The vibrating plate 12 is configured by, for example, $SiO_2$ or a laminated body of $SiO_2$ and $ZrO_2$. The thickness along the Z direction of the vibrating plate 12 is thickness sufficiently smaller than the element substrate 11. As explained above, the vibrating plate 12 is supported by the partition wall section 112 of the element substrate 11 configuring the opening section 111 to close the −Z side of the opening section 111.

A portion of the vibrating plate 12 overlapping the opening section 111, that is, a portion of the vibrating plate 12 closing the opening section 111 in plan view from the Z direction is divided into a plurality of active sections 121 by beam sections 141A provided in the sealing plate 14. That is, outer edges of the active sections 121 are defined by portions surrounded by an opening edge at the first surface 11A side of the opening section 111 and edges of the beam sections 141A. The active sections 121 are vibration regions vibrated in transmission and reception of ultrasound. The piezoelectric elements 13 are respectively provided in the active sections 121. The active sections 121 are capable of vibrating according to driving of the piezoelectric elements 13.

Configuration of the Piezoelectric Element 13

The piezoelectric element 13 is provided on each active section 121 on a surface of the vibrating plate 12 at the opposite side of the element substrate 11. The piezoelectric element 13 is configured by laminating a lower electrode 131, a piezoelectric film 132, and an upper electrode 133 in order from the vibrating plate 12 side.

One ultrasonic transducer Tr is configured by one active section 121 and the piezoelectric element 13 provided on the active section 121. In this embodiment, as shown in FIG. 2, a plurality of ultrasonic transducers Tr are disposed along the X direction and the Y direction in the ultrasonic sensor 10.

In the ultrasonic transducers Tr, a voltage is applied between the lower electrode 131 and the upper electrode 133, whereby the piezoelectric element 13 expands and contracts. The active section 121 in which the piezoelectric element 13 is provided vibrates at a frequency corresponding to the width of the active section 121. Consequently, ultrasound is transmitted from the active section 121.

When the active section 121 vibrates with the ultrasound input from the opening section 111, a potential difference occurs between upper and lower parts of the piezoelectric film 132. Consequently, it is possible to detect (receive) the ultrasound by detecting a potential difference that occurs between the lower electrode 131 and the upper electrode 133.

In this embodiment, as shown in FIG. 2, the lower electrodes 131 of the piezoelectric elements 13 adjacent to each other in the X direction among the piezoelectric elements 13 disposed in positions overlapping one opening section 111 in the plan view from the Z direction are coupled to configure one element row. The lower electrodes 131 of a predetermined number of element rows arranged in the Y direction are bound by a lower bypass wire 131A. The lower bypass wire 131A is coupled to a driving terminal 131P shown in FIG. 2.

That is, in this embodiment, one channel is configured by the predetermined number of element rows coupled by the lower bypass wire 131A. In FIG. 2, although not illustrated, a plurality of such channels are disposed in the Y direction in this embodiment. Driving terminals 131P independent from one another are provided in the channels. Therefore, it is possible to respectively individually drive the channels by respectively inputting independent driving signals to the driving terminals 131P.

On the other hand, as shown in FIG. 2, the upper electrode 133 is formed in a linear shape in the Y direction. The upper electrode 133 couples a plurality of ultrasonic transducers Tr arranged in the Y direction. Although not illustrated, ±Y-side end portions of the upper electrode 133 are bound one another and coupled to a common terminal 133P shown in FIG. 2 via an upper bypass wire. The upper electrode 133 is electrically coupled to the driving circuit 30 via the common terminal 133P. The same common potential is applied to the upper electrode 133.

Configuration of the Sealing Plate 14

The sealing plate 14 is provided on the −Z side of the vibrating plate 12 and has a function of reinforcing the element substrate 11 and the vibrating plate 12. A plane shape of the sealing plate 14 viewed from the Z direction is formed in, for example, the same shape as the element substrate 11. The sealing plate 14 is configured by a semiconductor substrate of Si or the like or an insulator substrate.

The sealing plate 14 includes, on a surface opposed to the vibrating plate 12, a plurality of projecting sections 141 projecting toward the vibrating plate 12. The projecting sections 141 have a shape in which the width in the X direction is sufficiently small compared with the width in the Y direction. The projecting sections 141 are longitudinally extended in the Y direction across the plurality of opening sections 111 and disposed at equal intervals along the X direction. Projecting distal end faces of the projecting sections 141, that is, surfaces of the projecting sections 141 opposed to the vibrating plate 12 are joined to the vibrating plate 12 by an adhesive or the like.

Among the projecting sections 141, the projecting sections 141 overlapping the opening sections 111 in the plan view from the Z direction configure the beam sections 141A and define the outer peripheral edges of the active sections 121 as explained above.

In this embodiment, among a plurality of beam sections 141A arranged in the X direction, a first beam section 141A1 defining a −X outer peripheral edge of the active section 121 at a −X-side end portion is joined to a position overlapping a −X-side end portion of the opening section 111 in the plan view from the Z direction. That is, as shown in FIG. 3, the first beam section 141A1 is joined to the vibrating plate 12 on the −Z side of the −X-side end portion (a third side 113C explained below) of the opening section 111. Among the plurality of beam sections 141A arranged in the X direction, a second beam section 141A2 (see FIG. 4) defining a +X outer peripheral edge of the active section 121 at a +X-side end portion is jointed to the vibrating plate 12 at the −Z side of a +X-side end portion (a fourth side 113D explained below) of the opening section 111.

Detailed Configuration of the Opening Section 111 in the Substrate 11

A specific configuration of the opening section 111 provided in the element substrate 11 is explained.

Figure 5:
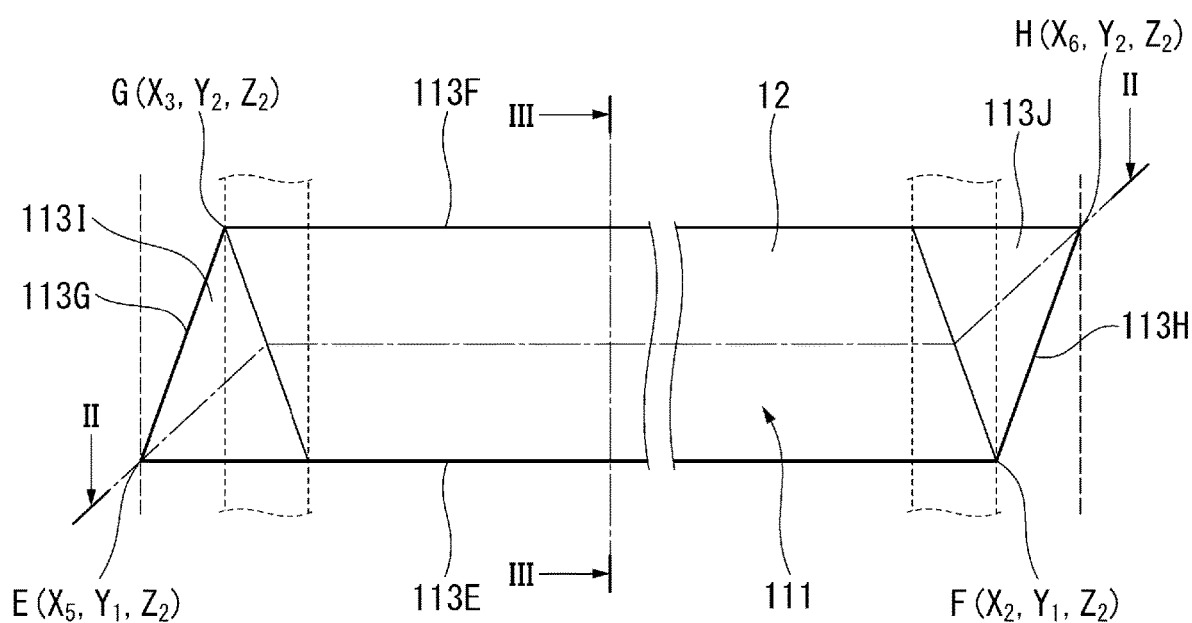
FIG. 5 is a plan view of the opening section of the element substrate in the first embodiment viewed from a second surface side.
Figure 6:
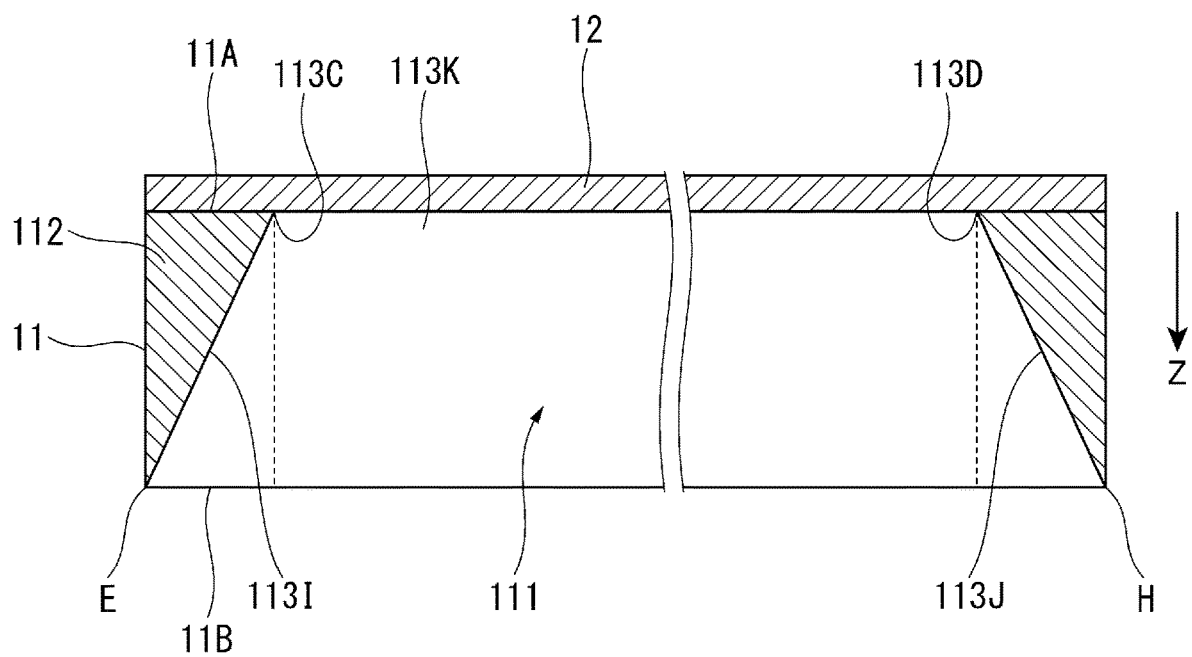
FIG. 6 is a sectional view showing a sectional shape of the element substrate and a vibrating plate taken along a II-II line in FIG. 5.
Figure 8:
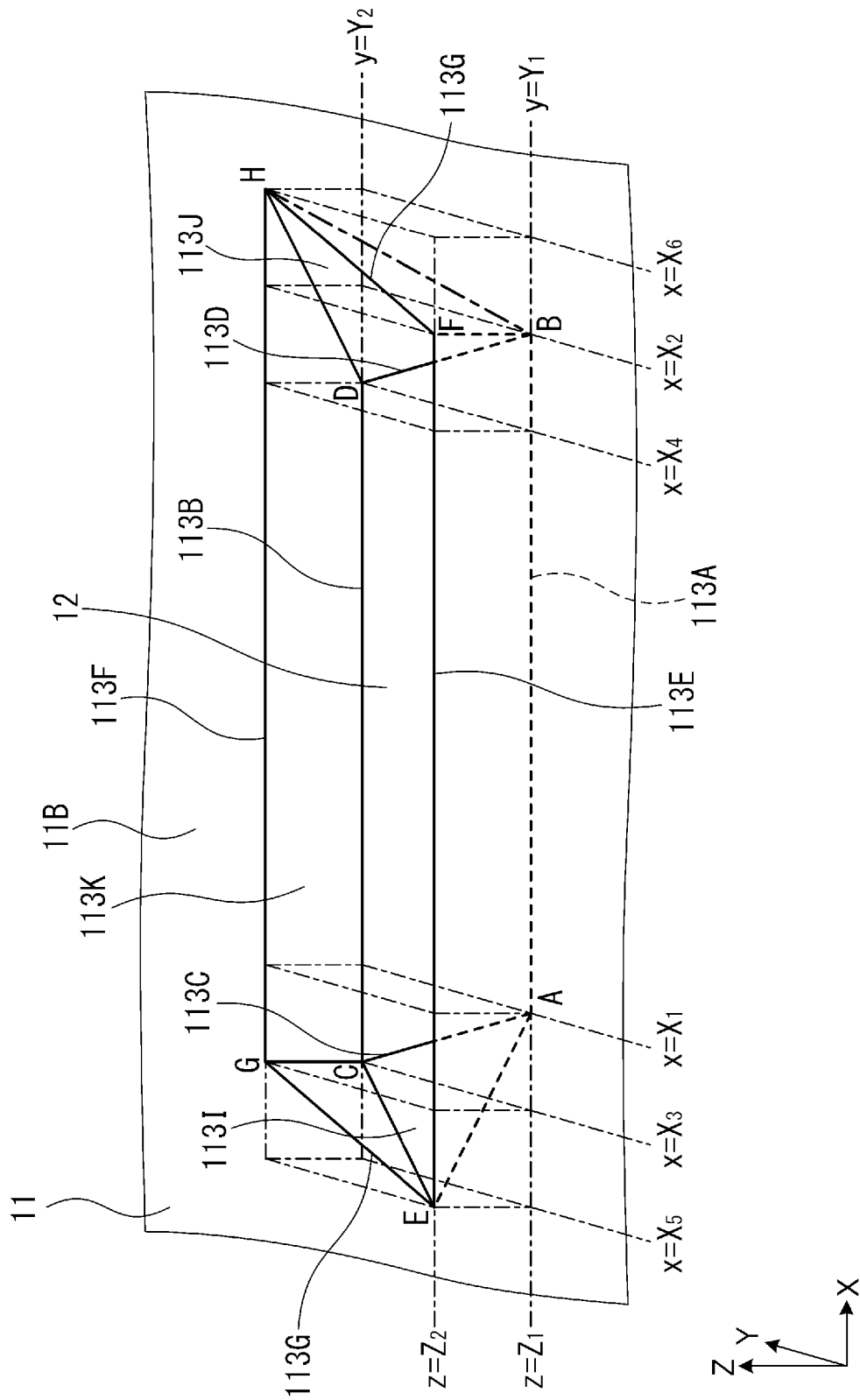
FIG. 8 is a perspective view of the opening section in the first embodiment viewed from the second surface side.

FIG. 4 is a diagram showing the shape of an opening edge at the time when the opening section 111 of an element substrate 11 is viewed from the first surface 11A side, that is, from the −Z side to the +Z side. FIG. 5 is a plan view of the opening section 111 of the element substrate 11 viewed from the second surface 11B side, that is, viewed from the +Z side to the −Z side. FIG. 6 is a sectional view showing a sectional shape of the element substrate 11 and the vibrating plate 12 taken along II-II line in FIG. 5. FIG. 7 is a sectional view showing a sectional shape of the element substrate 11 and the vibrating plate 12 taken along a III-III line in FIG. 5. FIG. 8 is a perspective view of the opening section 111 viewed from the second surface 11B side.

An opening edge in the first surface 11A of the opening section 111 is, as shown in FIG. 4, a parallelogram in which a first side 113A and a second side 113B are parallel and a third side 113C and a fourth side 113D are parallel. An intersection of the first side 113A and the third side 113C is represented as a point A, an intersection of the first side 113A and the fourth side 113D is represented as a point B, an intersection of the second side 113B and the third side 113C is represented as a point C, and an intersection of the second side 113B and the fourth side 113D is represented as a point D. XYZ coordinates of the points A to D are respectively the point A $(X_1, Y_1, Z_1)$, the point B $(X_2, Y_1, Z_1)$, the point C $(X_3, Y_2, Z_1)$, and the point D $(X_4, Y_2, Z_1)$; $X_3<X_1<X_4<X_2$ and $Y_1>Y_2$. The first side 113A and the second side 113B are parallel with respect to the X direction. The third side 113C and the fourth side 113D are inclined with respect to the first side 113A and the second side 113B, that is, coupled to the first side 113A and the second side 113B at an obtuse angle or an acute angle.

In the plan view from the Z direction, as shown in FIG. 4, the third side 113C is provided in a position overlapping the first beam section 141A1 and the fourth side 113D is provided in a position overlapping the second beam section 141A2.

An opening edge in the second surface 11B of the opening section 111 is, as shown in FIG. 5, a parallelogram in which a fifth side 113E and a sixth side 113F are parallel and a seventh side 113G and an eighth side 113H are parallel. XYZ coordinates of the points E to H are respectively the point E $(X_5, Y_1, Z_2)$, the point F $(X_2, Y_1, Z_2)$, the point G $(X_3, Y_2, Z_2)$, and the point H $(X_6, Y_2, Z_2)$; $X_5<X_3<X_1<X_4<X_2<X_6$. That is, the fifth side 113E and the sixth side 113F are parallel with respect to the X direction. The seventh side 113G and the eighth side 113H are inclined with respect to the fifth side 113E and the sixth side 113F, that is, coupled to the fifth side 113E and the sixth side 113F at an obtuse angle or an acute angle.

In the plan view from the Z direction, the first side 113A and the fifth side 113E overlap between $X_1$ and $X_4$ and the second side 113B and the sixth side 113F overlap between $X_1$ and $X_4$. Therefore, as shown in FIGS. 7 and 8, among surfaces of the partition wall section 112 facing the opening section 111, a surface parallel to the X direction including the first side 113A and the second side 113B is an orthogonal surface 113K substantially orthogonal to the vibrating plate 12.

As shown in FIGS. 5, 6, and 8, the opening section 111 includes a first inclined surface 113I inclined from the point E toward the third side 113C and a second inclined surface 113J inclined from the point H toward the fourth side 113D. Accordingly, in a sectional view of the ultrasonic sensor 10 taken along the X direction, as shown in FIG. 3, an inclined surface is formed at an end portion in the X direction of the opening section 111.

Such an opening section 111 is formed as explained below.

First, the element substrate 11 made of Si is prepared. The element substrate 11 is a substrate, a crystal surface of the second surface 11B of which is a (110) surface. First, in the element substrate 11, thermal oxidation treatment is applied to the first surface 11A side of the element substrate 11 to form an $SiO_2$ surface. A Zr layer is laminated on the $SiO_2$ surface, thermal oxidation treatment is applied to the Zr layer to form a ZrO₂ layer and form the vibrating plate 12. The piezoelectric elements 13 and a wiring electrode such as a bypass wire are formed on the vibrating plate 12.

Thereafter, a mask pattern for forming the opening section 111 is formed on the second surface 11B of the element substrate 11. Crystal anisotropic etching is performed from the second surface 11B to form the opening section 111. In this case, the orthogonal surface 113K, the first inclined surface 113I, and the second inclined surface 113J are formed by a (111) surface having a low etching rate.

In some ultrasonic sensors in the past, a plurality of square opening sections are formed in an element substrate in a two-dimensional array shape and a piezoelectric element is disposed on a vibrating plate closing the opening sections. To form such an ultrasonic sensor, crystal anisotropic etching is performed by forming a second surface on the opposite side of the vibration plate of the element substrate as a (100) surface having the highest etching rate. Consequently, it is possible to easily form truncated square pyramid-shaped opening sections having the (111) surface inclined from the vibrating plate toward the second surface. However, in such an ultrasonic sensor in the past, since the opening sections have the truncated square pyramid shape, the distance between the opening sections adjacent to each other is long. The ultrasonic sensor cannot be adapted to a reduction in size. That is, as the distance between the first opening section and the second opening section adjacent to each other, it is necessary to secure at least a total dimension of a dimension equivalent to a slope of the truncated square pyramid of the first opening section, a dimension equivalent to a slope of the truncated square pyramid of the second opening section, and a dimension of a partition wall section that supports the vibrating plate. If the second surface is formed as the (110) surface as in this embodiment, the opening sections having square opening edges at the vibrating plate side cannot be properly formed. It is difficult to obtain desired characteristics as a frequency characteristic of ultrasound and a vibration characteristic of the vibrating plate.

On the other hand, in this embodiment, the opening section 111 longitudinal in the X direction is covered by the vibrating plate 12, the plurality of beam sections 141A are joined from the opposite side of the element substrate 11 of the vibrating plate 12 to define the plurality of active sections 121, and the piezoelectric elements 13 are disposed on the active sections 121 to configure the ultrasonic transducer Tr.

In this case, the shape of the active section 121 can be determined by the beam section 141A. The distance between the active sections 121 can be defined by only the thickness in the X direction of the beam section 141A. Therefore, the interval between the active sections 121 in this embodiment can be set small compared with the ultrasonic sensor in the past in which the plurality of square opening sections are disposed. In this embodiment, as explained above, since the second surface 11B is formed as the (110) surface, it is possible to easily form the orthogonal surface 113K extending along the X direction. Therefore, compared with the ultrasonic sensor in the past, the distance between the opening sections 111 adjacent to each other in the Y direction can also be reduced. Consequently, it is possible to promote a further reduction in the size of the ultrasonic sensor.

Configuration of the Control Section 20

Referring back to FIG. 1, the control section 20 is explained.

The control section 20 includes a driving circuit 30 that drives the ultrasonic sensor 10 and an arithmetic operation section 40. Besides, the control section 20 may include a storing section having various data, various programs, and the like stored therein for controlling the distance measuring device 100.

The driving circuit 30 is a driver circuit for controlling the driving of the ultrasonic sensor 10. For example, as shown in FIG. 1, the driving circuit 30 includes a reference potential circuit 31, a changeover circuit 32, a transmission circuit 33, and a reception circuit 34.

The reference potential circuit 31 is coupled to the common terminal 133P of the upper electrode 133 of the ultrasonic sensor 10. The reference potential circuit 31 applies reference potential, for example, −3 V to the upper electrode 133.

The changeover circuit 32 is coupled to the driving terminal 131P, the transmission circuit 33, and the reception circuit 34. The changeover circuit 32 is configured by a switching circuit. The changeover circuit 32 changes over transmission connection for connecting each of the driving terminals 131P and the transmission circuit 33 and reception connection for connecting each of the driving terminals 131P and the reception circuit 34.

The transmission circuit 33 is coupled to the changeover circuit 32 and the arithmetic operation section 40. When the changeover circuit 32 is switched to the transmission connection, the transmission circuit 33 outputs a driving signal having a pulse waveform to the ultrasonic transducers Tr based on control by the arithmetic operation section 40 and causes the ultrasonic sensor 10 to transmit ultrasound.

The arithmetic operation section 40 is configured by, for example, a CPU (Central Processing Unit). The arithmetic operation section 40 controls the ultrasonic sensor 10 via the driving circuit 30 and causes the ultrasonic sensor 10 to carry out transmission and reception processing of ultrasound.

That is, the arithmetic operation section 40 switches the changeover circuit 32 to the transmission connection, causes the transmission circuit 33 to drive the ultrasonic sensor 10, and carries out transmission processing of ultrasound. Immediately after transmitting the ultrasound, the arithmetic operation section 40 switches the changeover circuit 32 to the reception connection and causes the ultrasonic sensor 10 to receive a reflected wave reflected on a target object. The arithmetic operation section 40 calculates a distance from the ultrasonic sensor 10 to the target object with a ToF (Time of Flight) method, using, for example, a time from transmission timing when the ultrasound is transmitted from the ultrasonic sensor 10 until a reception signal is received and sonic speed in the air.

Action Effects of this Embodiment

In this embodiment explained above, the following effects can be achieved.

The distance measuring device 100 in this embodiment includes the ultrasonic sensor 10 and the control section 20 that controls the ultrasonic sensor 10.

The ultrasonic sensor 10 includes the element substrate 11 having the first surface 11A and the second surface 11B and including the opening section 111 piercing through the element substrate 11 in the Z direction and the vibrating plate 12 provided on the first surface 11A and closing the opening section 111. The vibrating plate 12 is divided into the plurality of active sections 121 by the plurality of beam sections 141A joined to the surface of the vibrating plate 12 on the opposite side of the element substrate 11. The piezoelectric elements 13 are provided in the active sections 121. The opening edge in the first surface 11A of the opening section 111 includes the first side 113A and the second side 113B parallel to the X direction and the third side 113C and the fourth side 113D coupling the end portions of the first side 113A and the second side 113B. The third side 113C and the fourth side 113D are inclined at an acute angle or an obtuse angle with respect to the first side 113A and the second side 113B.

In such an ultrasonic sensor 10, even when a part of ultrasound output from the active sections 121 travels in the X direction in the opening section 111, the traveling direction of the ultrasound can be changed at the ±X-side end portions of the opening section 111. The influence of crosstalk caused by the ultrasound being made incident on the active sections 121 again can be suppressed. Since multiple reflection of the ultrasound between the ±X-side end portions is also suppressed in the opening section 111, a noise signal output from the piezoelectric elements 13 when a multiple reflection component is made incident on the active sections 121 can also be reduced. By suppressing the crosstalk and the noise signal in the ultrasonic sensor 10 in this way, it is possible to improve distance measurement accuracy in the distance measuring device 100.

In this embodiment, the opening edge in the second surface 11B of the opening section 111 includes the fifth side 113E and the sixth side 113F parallel to the X direction and the seventh side 113G and the eighth side 113H coupling the end portions of the fifth side 113E and the sixth side 113F at an acute angle or an obtuse angle. The fifth side 113E is the side at the +Z side of the first side 113A and overlaps the first side 113A in a range of X1 to X4 in the plan view from the Z direction. Similarly, the sixth side 113F is the side at the +Z side of the second side 113B and overlaps the second side 113B in a range of X1 to X4 in the plan view from the Z direction. That is, among the surfaces of the partition wall section 112, which configures the opening section 111, facing the opening section 111, the surface including the first side 113A and the fifth side 113E and the surface including the second side 113B and the sixth side 113F are the orthogonal surface 113K substantially orthogonal to the vibrating plate 12.

In such a configuration, for example, compared with when an opening section has a truncated square pyramid shape, the distance between the opening sections 111 adjacent to each other in the Y direction can be reduced. Consequently, when a predetermined number of ultrasonic transducers Tr is arranged in the Y direction, compared with the past, the distance between the ultrasonic transducers Tr can be reduced. Therefore, it is possible to promote a reduction in the size of the ultrasonic sensor 10.

When the ultrasonic transducers Tr are disposed in the Y direction on the element substrate 11 having a predetermined size, a larger number of ultrasonic transducers Tr can be disposed compared with the past. In this case, an increase in transmission ultrasound and improvement of reception sensitivity of ultrasound can be achieved. Since a large number of channels can be disposed along the Y direction, by controlling driving of the channels, it is possible to more precisely control a transmission direction and a beam shape of a beam of transmission ultrasound.

In this embodiment, the first side 113A is the side extended from the point A to the point B and the second side 113B is the side from the point C located further at the −X side and the +Y side than the point A to the point D located further at the −X side and the +Y side than the point B. The fifth side 113E is the side from the point E located further at the −X side, the −Y side, and the +Z side than the point C to the point F at the +Z side of the point B and the sixth side 113F is the side from the point G at the +Z side of the point C to the point H located further at the +X side, the +Y side, and the +Z side than the point B. In this embodiment, the opening section 111 includes the first inclined surface 113I inclined from the point E toward the third side 113C and the second inclined surface 113J inclined from the point H toward the fourth side 113D.

In such a configuration, ultrasound output from the active sections 121 and traveling in the X direction in the opening section 111 can be reflected on the first inclined surface 113I and the second inclined surface 113J to the direction separating from the opening section 111. Consequently, it is possible to more properly suppress the multiple reflection of the ultrasound in the opening section 111 and further reduce the crosstalk and the noise signal.

In the configuration in which the vibrating plate 12 closing the opening section 111 is provided on the element substrate 11, the vibrating plate 12 is deformed to a position overlapping the opening section 111 when the active sections 121 vibrate or when a pressure wave is received from the outside. In this case, it is likely that stress concentrates on positions of the vibrating plate 12 overlapping the opening edge on the first surface 11A side of the opening section 111, in particular, the third side 113C and the fourth side 113D and a crack occurs in the vibrating plate 12.

On the other hand, in this embodiment, since the first inclined surface 113I and the second inclined surface 113J are provided, stress in positions of the vibrating plate 12 overlapping the third side 113C and the fourth side 113D can be suppressed. A crack of the vibrating plate 12 can be suppressed. Consequently, it is possible to improve reliability of the ultrasonic sensor 10.

In this embodiment, the plurality of beam sections 141A that divide the vibrating plate 12 overlapping the opening section 111 in the plan view into the plurality of active sections 121 are provided between the active sections 121 adjacent to one another at the opposite side of the element substrate 11 of the vibrating plate 12.

In such a configuration, for example, compared with when a plurality of square opening sections are disposed along the X direction on an element substrate to configure an ultrasonic transducer, the interval among the ultrasonic transducers arranged in the X direction can be reduced. That is, when the plurality of square opening sections are disposed in the X direction of the element substrate, crystal anisotropic etching is performed by forming a second surface of the element substrate as the (100) surface. In this case, the opening sections have a truncated square pyramid shape. On the other hand, in this embodiment, the width in the X direction of the active section 121 can be defined by the width in the X direction of the beam section 141A. A large number of active sections 121 can be disposed in the X direction.

In this embodiment, the third side 113C and the fourth side 113D at the ±X-side end portions of the opening section 111 are provided in the positions overlapping the beam sections 141A in the plan view from the Z direction.

As explained above, in the configuration in which the vibrating plate 12 closing the opening section 111 is provided on the element substrate 11, it is likely that stress concentrates on the positions of the vibrating plate 12 overlapping the third side 113C and the fourth side 113D and a crack occurs in the vibrating plate 12.

On the other hand, in this embodiment, the beam sections 141A are provided in the positions overlapping the third side 113C and the fourth side 113D, which are the opening edge of the opening section 111 on the first surface 11A. Consequently, stress in the positions of the vibrating plate 12 overlapping the opening edge of the opening section 111 can be further suppressed. A crack of the vibrating plate 12 can be suppressed. Consequently, it is possible to further improve reliability of the ultrasonic sensor 10.

Second Embodiment

A second embodiment is explained.

In the first embodiment, the configuration is illustrated in which the beam sections 141A are provided in the positions overlapping the third side 113C and the fourth side 113D of the opening section 111. The second embodiment is different from the first embodiment in that the third side 113C and the fourth side 113D of the opening section 111 are provided at the outer side of the beam sections 141A. In the following explanation, the components explained above are denoted by the same reference numerals and signs and explanation of the components is omitted or simplified.

Figure 9:
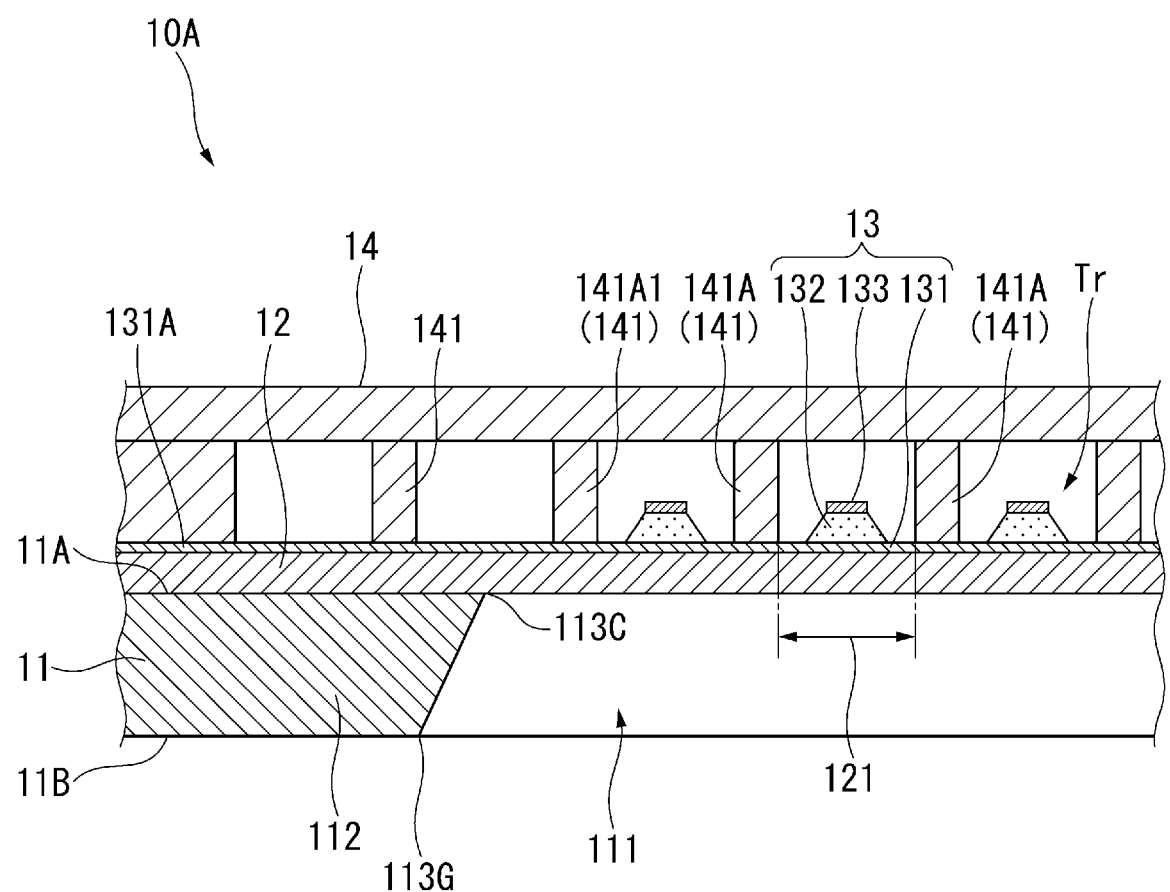
FIG. 9 is a sectional view along an X direction of an ultrasonic sensor in a second embodiment.

FIG. 9 is a sectional view along the X direction of an ultrasonic sensor 10A in the second embodiment.

In this embodiment, as shown in FIG. 9, the third side 113C of the opening section 111 is located further at the −X side than the beam section 141A. That is, the third side 113C is located between the first beam section 141A1 defining the edge at the −X side of the active section 121 at the −X-side end portion and the projecting section 141 provided at the −X side of the first beam section 141A1.

Although not illustrated in FIG. 9, a positional relation between the fourth side 113D and the beam section 141A is the same. The fourth side 113D is located further at the +X side than the beam section 141A. That is, the fourth side 113D is located between the second beam section 141A2 defining the edge at the +X side of the active section 121 at the +X-side end portion and the projecting section 141 provided at the +X side of the second beam section 141A2.

Acton Effects of this Embodiment

In this embodiment, the third side 113C and the fourth side 113D are located further at a side separating from the active section 121 than the beam section 141A. That is, the third side 113C is located further at the −X side than the first beam section 141A1 disposed at the end portion at the −X side among the plurality of beam sections 141A arranged in the X direction. The fourth side 113D is located further at the +X side than the second beam section 141A2 disposed at the end portion at the +X side among the plurality of beam sections 141A arranged in the X direction.

In such a configuration, the vibration of the active section 121 is less easily transmitted to the third side 113C and the fourth side 113D at the ±X-side end portions of the opening section 111. A crack of the vibrating plate 12 can be suppressed.

Modifications

The present disclosure is not limited to the embodiments explained above. Modifications and improvements in a range in which the object of the present disclosure can be achieved and configurations obtained by, for example, combining the embodiments as appropriate are included in the present disclosure.

Modification 1

In the second embodiment, the projecting sections 141 may be further disposed in positions overlapping the third side 113C and the fourth side 113D in the plan view from the Z direction.

In this case, it is possible to further reinforce, with the projecting sections 141, the ±X-side end portions of the opening section 111 on which stress concentrates in the vibrating plate 12.

Modification 2

In the first and second embodiments, the second surface 11B of the element substrate 11 is formed by the (110) surface and the first inclined surface 113I and the second inclined surface 113J are formed by crystal anisotropic etching. However, the present disclosure is not limited to this.

For example, the opening section 111 may be formed by dry etching using an ion milling device. In this case, the first inclined surface 113I and the second inclined surface 113J are not provided. An opening edge on the second surface 11B side of the opening section 111 coincides with an opening edge at the first surface 11A side in the plan view from the Z direction. That is, the opening section 111 is surrounded by an orthogonal surface substantially orthogonal to the vibrating plate 12. Even in such a case, an orthogonal surface including the third side 113C and an orthogonal surface including the fourth side 113D are inclined with respect to the X direction. Accordingly, it is possible to suppress an inconvenience that ultrasound output from the active section 121 in the X direction is reflected at the ±X-side end portions of the opening section 111. It is possible to reduce crosstalk.

The opening section 111 may be formed by the crystal anisotropic etching by forming the second surface 11B of the element substrate 11 as the (100) surface. In this case, the orthogonal surface orthogonal to the vibrating plate 12 is not included in the surfaces of the partition wall section 112, which configures the opening section 111, facing the opening section 111. It is possible to reduce stress concentration in a position of the vibrating plate 12 overlapping the opening edge of the opening section 111.

Modification 3

In the first embodiment, the distance measuring device 100 is illustrated as an example of the electronic device. However, the present disclosure is not limited to this. The present disclosure can be applied to, for example, an ultrasonic measurement device that measures an internal tomographic image of a structure according to a transmission and reception result of ultrasound.

Besides, a specific structure in implementation of the present disclosure may be configured by combining the embodiments and the modifications as appropriate in a range in which the object of the present disclosure can be achieved or may be changed to other structures and the like as appropriate.

What is claimed is:

1. An ultrasonic sensor comprising:
an element substrate having a first surface and a second surface at an opposite side of the first surface and including an opening section piercing through the element substrate in a Z direction from the first surface to the second surface;

a vibrating plate provided on the first surface of the element substrate to close the opening section, a plurality of vibration regions extending along an X direction orthogonal to the Z direction being provided on the vibrating plate in positions overlapping the opening section in plan view from the Z direction;

a plurality of piezoelectric elements provided to respectively correspond to the plurality of vibration regions of the vibrating plate; and a plurality of beam sections provided among the vibration regions adjacent to one another at an opposite side of the element substrate of the vibrating plate and dividing the vibrating plate overlapping the opening section in the plan view into the plurality of vibration regions, wherein the opening section includes, on the first surface, a first side and a second side parallel to the X direction and a third side and a fourth side coupling end portions in the X direction of the first side and the second side at an acute angle or an obtuse angle with respect to the first side and the second side, and the third side and the fourth side are provided in positions overlapping the beam sections in the plan view.

2. The ultrasonic sensor according to claim 1, wherein the opening section includes, on the second surface, a fifth side and a sixth side parallel to the X direction and a seventh side and an eighth side coupling end portions of the fifth side and the sixth side at an acute angle or an obtuse angle with respect to the first side and the fifth side, the first side and the fifth side at least partially overlap each other in the plan view from the Z direction, and the second side and the sixth side at least partially overlap each other in the plan view from the Z direction.

3. The ultrasonic sensor according to claim 2, wherein when a direction orthogonal to the X direction is represented as a Y direction, the first side is a side extended from a point A $(X_1, Y_1, Z_1)$ to a point B $(X_2, Y_1, Z_1)$ further at a +X side than the point A $(X_1, Y_1, Z_1)$ in an XYZ coordinate, the second side is a side from a point C $(X_3, Y_2, Z_1)$ located further at a −X side and a +Y side than the point A $(X_1, Y_1, Z_1)$ to a point D $(X_4, Y_2, Z_1)$ located further at the −X side and the +Y side than the point B $(X_2, Y_1, Z_1)$ in the XYZ coordinate, the third side is a side from the point A $(X_1, Y_1, Z_1)$ to the point C $(X_3, Y_2, Z_1)$ in the XYZ coordinate, the fourth side is a side from the point B $(X_2, Y_1, Z_1)$ to the point D $(X_4, Y_2, Z_1)$ in the XYZ coordinate, the fifth side is a side from a point E $(X_5, Y_1, Z_2)$ located further at the −X side, a −Y side, and a +Z side than the point C $(X_3, Y_2, Z_1)$ to a point F $(X_2, Y_1, Z_2)$ at the +Z side of the point B $(X_2, Y_1, Z_1)$ in the XYZ coordinate, the sixth side is a side from a point G $(X_3, Y_2, Z_2)$ at the +Z side of the point C $(X_3, Y_2, Z_1)$ to a point H $(X_6, Y_2, Z_2)$ located further at the +X side, the +Y side, and the +Z side than the point B $(X_2, Y_1, Z_1)$ in the XYZ coordinate, and the opening section includes a first inclined surface extending from the point E $(X_5, Y_1, Z_2)$ to the third side and a second inclined surface extending from the point H $(X_6, Y_2, Z_2)$ to the fourth side.

4. The ultrasonic sensor according to claim 1, wherein the third side and the fourth side are located further at a side separating from the vibration regions than the beam sections.

5. An electronic device comprising:

the ultrasonic sensor according to claim 1; and a control section configured to control the ultrasonic sensor.

* * * * *